US006992326B1

(12) United States Patent
MacPherson et al.

(10) Patent No.: US 6,992,326 B1
(45) Date of Patent: Jan. 31, 2006

(54) ELECTRONIC DEVICE AND PROCESS FOR FORMING SAME

(75) Inventors: Charles Douglas MacPherson, Santa Barbara, CA (US); Matthew Stainer, Goleta, CA (US); Michael Anzlowar, Santa Barbara, CA (US); Paul Anthony Sant, Santa Barbara, CA (US); Sughosh Venkatesh, Goleta, CA (US)

(73) Assignee: DuPont Displays, Inc., Santa Barbara, CA (US)

( * ) Notice: Subject to any disclaimer, the term of this patent is extended or adjusted under 35 U.S.C. 154(b) by 0 days.

(21) Appl. No.: 10/910,496

(22) Filed: Aug. 3, 2004

(51) Int. Cl.
*H01L 35/24* (2006.01)

(52) U.S. Cl. ............................ 257/40; 257/99; 438/99

(58) Field of Classification Search .................. 257/40, 257/99, 642; 438/99; 313/503, 504
See application file for complete search history.

(56) References Cited

U.S. PATENT DOCUMENTS

| | | | | |
|---|---|---|---|---|
| 5,589,732 | A | 12/1996 | Okibayashi et al. | |
| 5,714,840 | A | 2/1998 | Tanabe et al. | |
| 6,075,319 | A | 6/2000 | Kanda et al. | |
| 6,160,345 | A | 12/2000 | Tanaka et al. | |
| 6,242,859 | B1 | 6/2001 | Betsui et al. | |
| 6,309,501 | B1 | 10/2001 | Kelley | |
| 6,476,988 | B1 | 11/2002 | Yudasaka | |
| 6,548,961 | B2 * | 4/2003 | Barth et al. | 315/169.3 |
| 6,596,443 | B2 | 7/2003 | Weaver et al. | |
| 2002/0036468 | A1 | 3/2002 | Tanaka et al. | |
| 2002/0060518 | A1 | 5/2002 | Duinevald et al. | |
| 2002/0109458 | A1 | 8/2002 | Morii et al. | |
| 2002/0113547 | A1 | 8/2002 | Ishikawa et al. | |
| 2002/0163300 | A1 | 11/2002 | Duinevald et al. | |
| 2003/0011304 | A1 | 1/2003 | Dulnevald et al. | |
| 2003/0068574 | A1 | 4/2003 | Shiraki et al. | |
| 2003/0076608 | A1 | 4/2003 | Yudasaka | |
| 2004/0101988 | A1 | 5/2004 | Roman, Jr. et al. | |

FOREIGN PATENT DOCUMENTS

| | | | |
|---|---|---|---|
| JP | 6-325873 | A | 11/1994 |
| JP | 2002-124381 | A | 4/2002 |
| WO | WO 02/21883 | A1 | 3/2002 |

* cited by examiner

*Primary Examiner*—Sara Crane

(57) ABSTRACT

An electronic device includes a substrate, a structure having openings, and a first electrode overlying the structure and lying within the openings. From a cross-sectional view, the structure, at the openings, has a negative slope. From a plan view, each opening has a perimeter that may or may not substantially correspond to a perimeter of an organic electronic component. The portions of the first electrode overlying the structure and lying within the openings are connected to each other. In a process for forming the electronic device, an organic active layer may be deposited within the opening, wherein the organic active layer has a liquid composition.

22 Claims, 10 Drawing Sheets

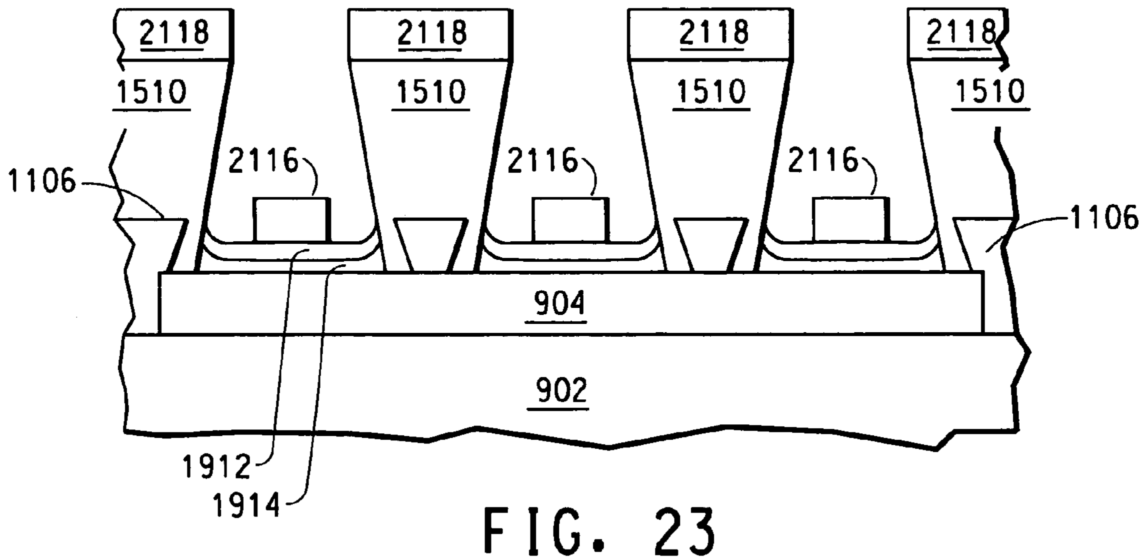
FIG. 23
FIG. 24
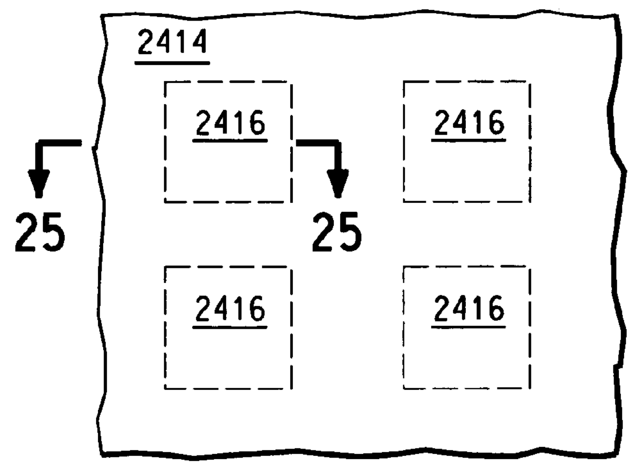
FIG. 25
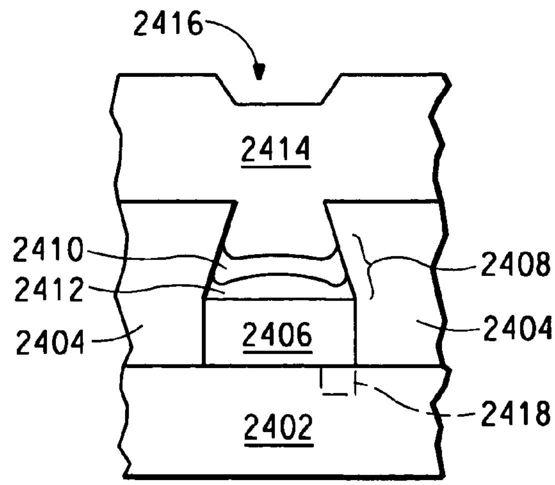

ELECTRONIC DEVICE AND PROCESS FOR FORMING SAME

STATEMENT AS TO FEDERALLY SPONSORED RESEARCH

This invention was made with Government support under DARPA grant number 4332. The Government may have certain rights in the invention.

FIELD OF THE INVENTION

This invention relates in general to electronic devices and methods for forming electronic devices. More specifically, the invention relates to electronic devices including organic electronic components.

BACKGROUND INFORMATION

Increasingly, active organic molecules are used in electronic devices. These active organic molecules have electronic or electro-radiative properties including electroluminescence. Electronic devices that incorporate organic active materials may be used to convert electrical energy into radiation and may include a light-emitting diode, light-emitting diode display, or diode laser. Electronic devices that incorporate organic active layers may also be used to generate signals in response to radiation (e.g., photodetectors (e.g., photoconductive cells, photoresistors, photoswitches, phototransistors, phototubes), infrared ("IR") detectors, biosensors); convert radiation into electrical energy (e.g., a photovoltaic device or solar cell); and perform logic functions (e.g. a transistor or diode).

However, the manufacturing of electronic components that include organic active layers is difficult. Inconsistent formation of organic active layers typically leads to poor device performance and poor yield in device fabricating processes. In the case of liquid deposition of organic active layers, poor wetting of electrodes may lead to voids within the organic active layer.

FIG. 1 illustrates a plan view of a prior art structure 102 and FIG. 2 illustrates a cross-sectional view of the prior art structure 102. The structure 102 has a perimeter having a positive slope as seen from the cross-sectional view of FIG. 2. When a liquid composition 106 is deposited into the well formed by the surrounding structure 102, it may form voids. Such voids decrease the available surface area for radiation emission or radiation absorption, leading to reduced performance. Voids, such as void 108, may also expose underlying structures 104, such as electrodes. When additional layers are formed over organic layers resulting from curing the liquid composition, these layers may contact the underlying structure 104, permitting electrical shorting between electrodes and rendering an affected organic electronic component inoperable.

In addition, if structure 102 is hydrophobic (i.e., has a high wetting angle), poor wetting of liquid composition 106 can occur in the well near the structure 102, and can result in thinning of the organic layer. Although the organic layer may be thick enough to prevent electrical shorting between electrodes, the thin organic layer at the pixel edges can result in low rectification ratios and low luminance efficiencies.

SUMMARY OF THE INVENTION

In one exemplary embodiment, an electronic device includes a substrate, a structure having openings, and a first electrode overlying the structure and lying within the openings. From a cross-sectional view, the structure, at the openings, has a negative slope. From a plan view, each opening has a perimeter that substantially corresponds to a perimeter of an organic electronic component. Portions of the first electrode overlying the structure and lying within the openings are connected to each other.

In a further embodiment, an electronic device includes a substrate, a first structure overlying the substrate, and a second structure overlying the substrate. From a cross-sectional view, the first structure has a negative slope and, from a plan view, the first structure has a first pattern. From a cross-sectional view, the second structure has a negative slope and, from a plan view, the second structure has a second pattern different from the first pattern. The first structure has a portion that contacts the second structure.

In another exemplary embodiment, a process for forming an electronic device includes forming a structure having a negative slope and openings. From a plan view, each opening has a perimeter that substantially corresponds to a perimeter of an organic electronic component. The process also includes depositing an organic active layer within the openings. The organic active layer has a liquid composition. The process further includes forming a first electrode overlying the structure and the organic active layer and lying within the openings. Portions of the first electrode overlying the structure and lying within the openings are connected to each other. The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 19:
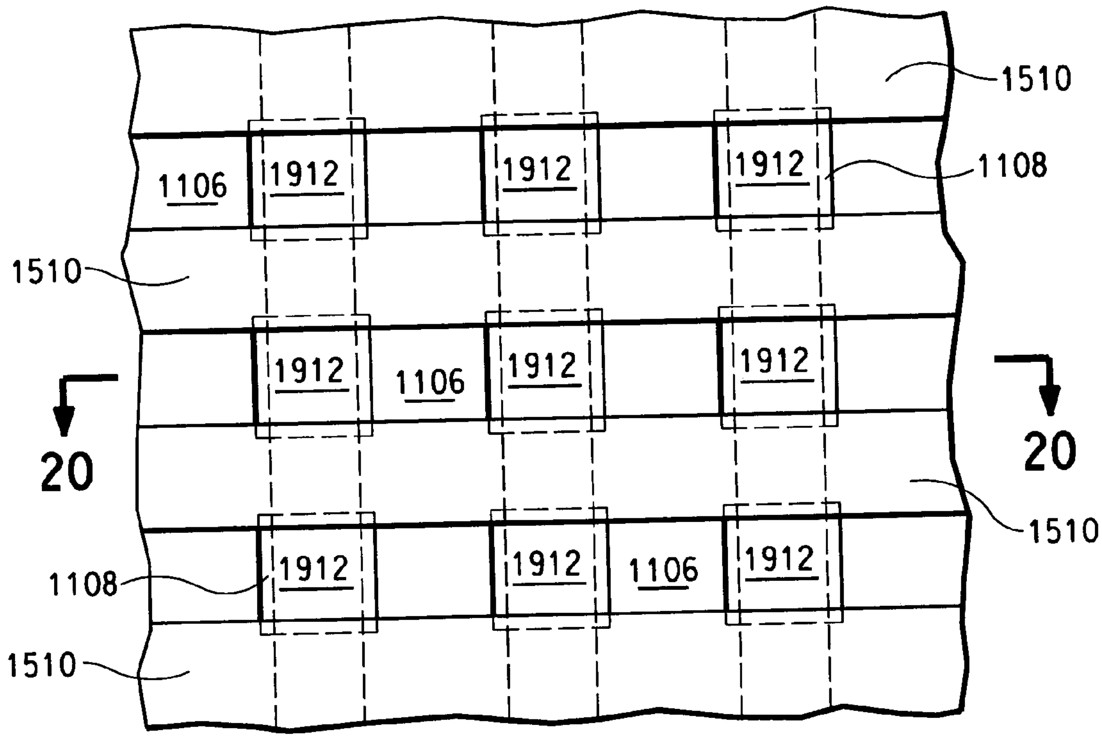
FIGS. 19 and 20 include illustrations of a plan view and a cross-section view, respectively, of the substrate of FIG. 15 after forming organic layers over the substrate, first electrode, well structure, and separator structure.
Figure 20:
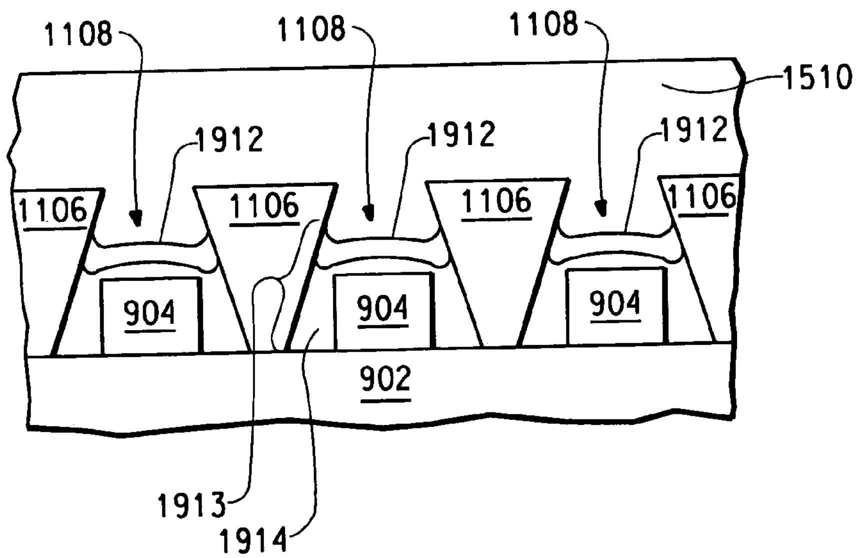
Figure 21:
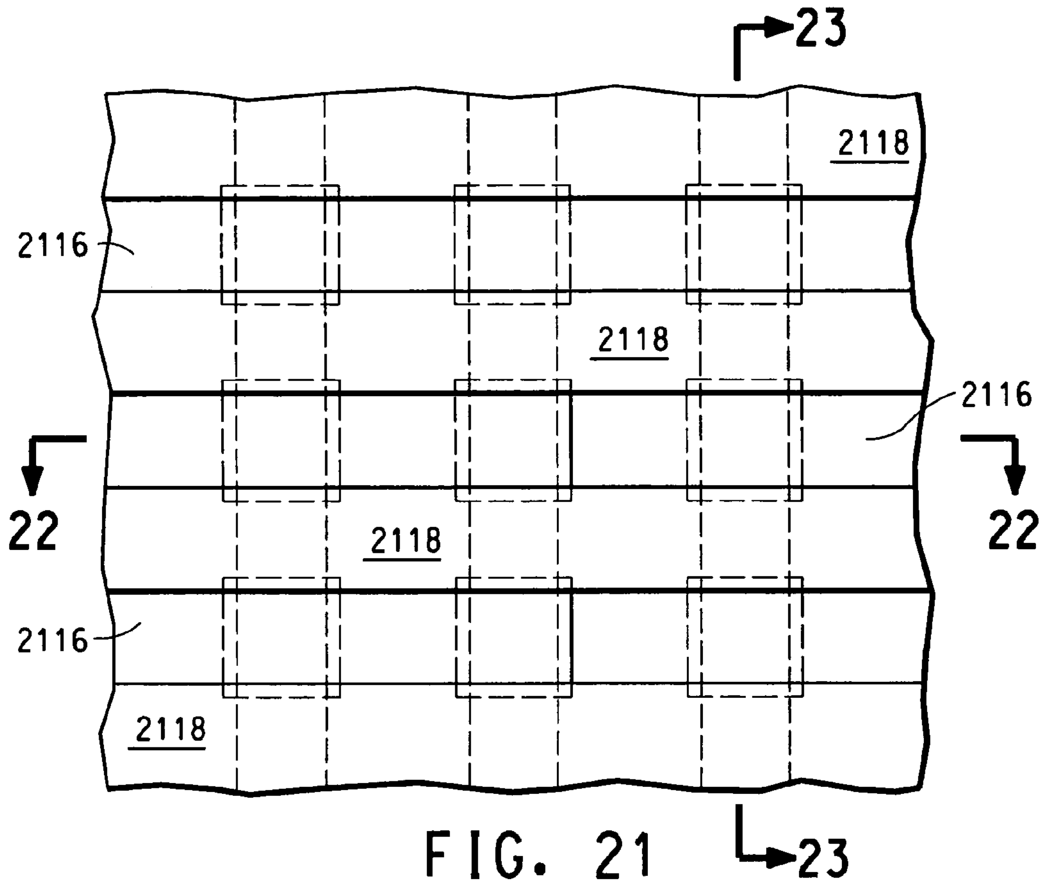
Figure 22:
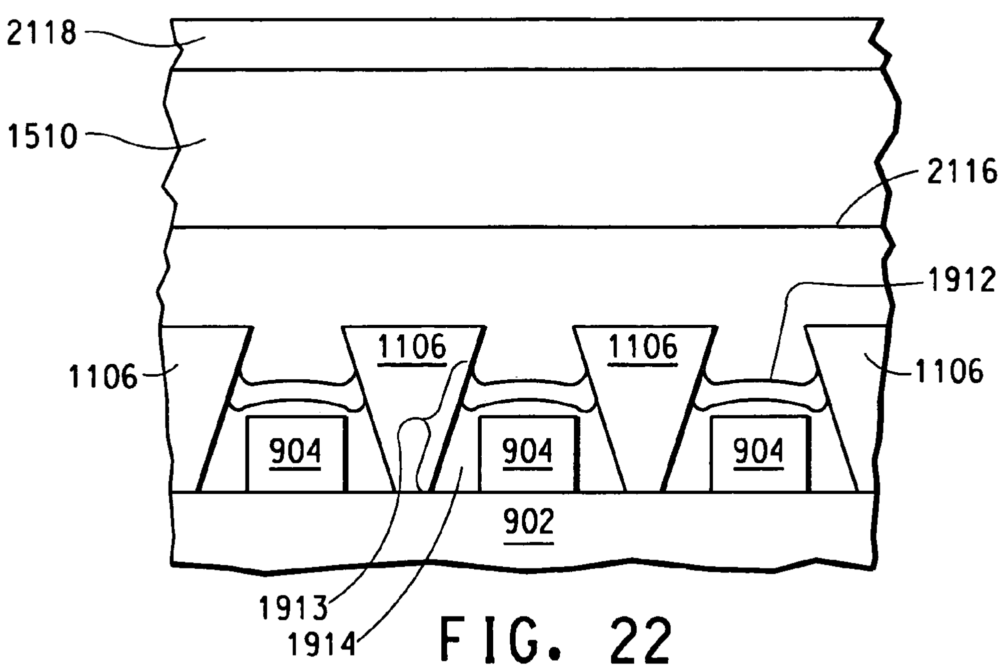

FIGS. 21, 22, and 23 include illustrations of a plan view, a cross-sectional view, and cross-sectional views, respectively, of the substrate of FIGS. 19 and 20 after forming a second electrode over the substrate, first electrode, well structure, separator structure, and organic layers.

FIGS. 24 and 25 include illustrations of a plan view and a cross-section view, respectively, of a portion of an active-matrix display having a common electrode.

DETAILED DESCRIPTION

In one embodiment, an electronic device includes a substrate, a structure having openings, and a first electrode overlying the structure and lying within the openings. From a cross-sectional view, the structure, at the openings, has a negative slope. From a plan view, each opening has a perimeter that substantially corresponds to a perimeter of an organic electronic component. Portions of the first electrode overlying the structure and lying within the openings are connected to each other.

In one exemplary embodiment, a surface of the structure is hydrophobic. In a further exemplary embodiment, a second electrode lies between the substrate and the structure. In an additional embodiment, the second electrode has a surface that is hydrophilic. In another exemplary embodiment, the substrate includes a driver circuit coupled to the organic electronic component.

In a further embodiment, an electronic device includes a substrate, a first structure overlying the substrate, and a second structure overlying the substrate. From a cross-sectional view, the first structure has a negative slope and, from a plan view, the first structure has a first pattern. From a cross-sectional view, the second structure has a negative slope and, from a plan view, the second structure has a second pattern different from the first pattern. The first structure has a portion that contacts the second structure.

In one exemplary embodiment, the first structure includes openings, wherein, from a plan view, each opening has a perimeter that substantially corresponds to a perimeter of an organic electronic component. In another exemplary embodiment, the electronic device includes an electrode overlying at least portions of the first structure and the second structure. In a further exemplary embodiment, the electrode lies within the openings and is continuous between the openings. In an additional embodiment, the second structure has a thickness at least 1.5 times greater than a thickness of the first structure. In another exemplary embodiment, the first structure has a thickness no more than about 3 micrometers. In a further exemplary embodiment, the second structure has a thickness at least about 3 micrometers. In an additional exemplary embodiment, the electronic device includes an electrode between the substrate and the first structure. In another exemplary embodiment, the electrode has a surface that is hydrophilic. In a further exemplary embodiment, the electronic device comprises a passive matrix display. In an additional exemplary embodiment, the first structure and the second structure have surfaces that are hydrophobic.

In another exemplary embodiment, a process for forming an electronic device includes forming a structure having a negative slope and openings. From a plan view, each opening has a perimeter that substantially corresponds to a perimeter of an organic electronic component. The process also includes depositing an organic active layer within the openings. The organic active layer has a liquid composition. The process further includes forming a first electrode overlying the structure and the organic active layer and lying within the openings. Portions of the first electrode overlying the structure and lying within the openings are connected to each other.

In one exemplary embodiment, the process includes forming a second electrode before forming the structure, wherein after forming the structure, portions of the second electrode are exposed along the bottoms of the openings. In another exemplary embodiment, the liquid composition contacts the second electrode at a wetting angle of less than 90 degrees. In a further exemplary embodiment, the liquid composition contacts the structure at a wetting angle of at least 45 degrees.

For each of the exemplary embodiments disclosed above, the organic electronic components may include an organic active layer.

Other features and advantages of the invention will be apparent from the following detailed description, and from the claims. The detailed description first addresses Definitions followed by Structures, Layers and Components of an Electronic device, Process for Forming Electronic Devices, and Other Embodiments.

1. Definitions and Clarification of Terms

Before addressing details of embodiments described below, some terms are defined or clarified. As used herein, the term "active" when referring to a layer or material is intended to mean a layer or material that has electronic or electro-radiative properties. An active layer material may emit radiation or exhibit a change in concentration of electron-hole pairs when receiving radiation.

The term "active matrix" is intended to mean an array of electronic components and corresponding driver circuits within the array.

The term "circuit" is intended to mean a collection of electronic components that collectively, when properly connected and supplied with the proper potential(s), performs a function. A circuit may include an active matrix pixel within an array of a display, a column or row decoder, a column or row array strobe, a sense amplifier, a signal or data driver, or the like.

The term "connected," with respect to electronic components, circuits, or portions thereof, is intended to mean that two or more electronic components, circuits, or any combination of at least one electronic component and at least one circuit do not have any intervening electronic component lying between them. Parasitic resistance, parasitic capacitance, or both are not considered electronic components for the purposes of this definition. In one embodiment, electronic components are connected when they are electrically shorted to one another and lie at substantially the same voltage. Note that electronic components can be connected together using fiber optic lines to allow optical signals to be transmitted between such electronic components.

The term "coupled" is intended to mean a connection, linking, or association of two or more electronic components, circuits, systems, or any combination of at least two of: (1) at least one electronic component, (2) at least one circuit, or (3) at least one system in such a way that a signal (e.g., current, voltage, or optical signal) may be transferred from one to another. Non-limiting examples of "coupled" can include direct connections between electronic components, circuits or electronic components with switch(es) (e.g., transistor(s)) connected between them, or the like.

The term "driver circuit" is intended to mean a circuit configured to control the activation of an electronic component, such as an organic electronic component.

The term "electrically continuous" is intended to mean a layer, member, or structure that forms an electrical conduction path without an electrical open circuit.

The term "electrode" is intended to mean a structure configured to transport carriers. For example, an electrode may be an anode, a cathode. Electrodes may include parts of transistors, capacitors, resistors, inductors, diodes, organic electronic components and power supplies.

The term "electronic component" is intended to mean a lowest level unit of a circuit that performs an electrical function. An electronic component may include a transistor, a diode, a resistor, a capacitor, an inductor, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the proper potential(s), performs a function. An electronic device may include, or be part of, a system. Examples of electronic devices include displays, sensor arrays, computer systems, avionics, automobiles, cellular phones, and many other consumer and industrial electronic products.

The term "hydrophilic" is intended to mean that an edge of a liquid exhibits a wetting angle less than 90 degrees with respect to a surface that it contacts.

The term "hydrophobic" is intended to mean that an edge of a liquid exhibits a wetting angle of 90 degrees or more with respect to a surface that it contacts.

The term "layer" is used interchangeably with the term "film" and refers to a coating covering a desired area. The area can be as large as an entire device or as small as a specific functional area such as the actual visual display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

The term "liquid composition" is intended to mean an organic active material that is dissolved in a liquid medium or media to form a solution, dispersed in a liquid medium or media to form a dispersion, or suspended in a liquid medium or media to form a suspension or an emulsion.

Figure 3:
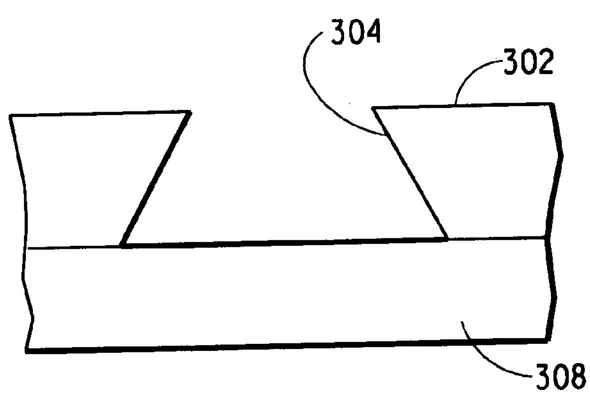
FIGS. 3, 5, 6 and 7 include illustrations of a cross-sectional view, a plan view, a plan view, and a cross-sectional view of a portion of an exemplary embodiment of a well structure before, during, and after a liquid composition is placed within the well structure.
Figure 4:
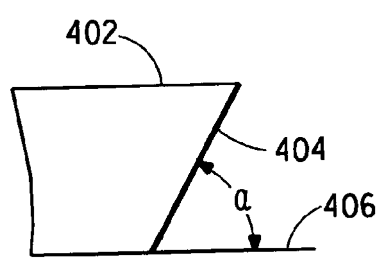
FIGS. 4 and 8 include illustrations of cross-sectional views of the well structure of FIGS. 3, 5, 6, and 7 before an after a liquid composition comes in contact with an edge having a negative slope.

The term "negative slope" is intended to mean a characteristic of a structure, wherein a side of the structure forms an acute angle $\alpha$ (alpha), as more fully described in the detailed description of FIGS. 3 and 4, with respect to a substantially planar surface over which the structure is formed.

The term "opening" is intended to mean an area characterized by the absence of a particular structure that surrounds the area, as viewed from the perspective of a plan view.

The term "organic electronic device" is intended to mean a device including one or more semiconductor layers or materials. Organic electronic devices include: (1) devices that convert electrical energy into radiation (e.g., an light-emitting diode, light emitting diode display, or diode laser), (2) devices that detect signals through electronics processes (e.g., photodetectors (e.g., photoconductive cells, photoresistors, photoswitches, phototransistors, or phototubes), IR detectors, or biosensors), (3) devices that convert radiation into electrical energy (e.g., a photovoltaic device or solar cell), and (4) devices that include one or more electronic components that include one or more organic semiconductor layers (e.g., a transistor or diode).

The term "overlying," when used to refer to layers, members or structures within a device, does not necessarily mean that one layer, member or structure is immediately next to or in contact with another layer, member, or structure.

The term "passive matrix" is intended to mean an array of electronic components, wherein the array does not have any driver circuits.

The term "perimeter" is intended to mean a boundary of a layer, member, or structure that, from a plan view, forms a closed planar shape.

The term "structure" is intended to mean one or more patterned layers or members, which by itself or in combination with other patterned layer(s) or member(s), forms a unit that serves an intended purpose. Examples of structures include electrodes, well structures, cathode separators, and the like.

The term "substrate" is intended to mean a base material that can be either rigid or flexible and may be include one or more layers of one or more materials, which can include, but are not limited to, glass, polymer, metal or ceramic materials or combinations thereof.

The term "wetting angle" is intended to mean a tangent angle at the edge interface between a gas, a liquid and a solid surface as measured from the solid surface through the liquid to a gas/liquid interface.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

2. Structures, Layers, and Components of an Electronic Device

In a particular embodiment, an electronic device includes an array of organic electronic components and a structure having openings that correspond to a perimeter of each of the organic electronic components when viewed from a plan view. The structure has a negative slope at the openings when viewed from a cross-sectional view. Each organic electronic component may include first and second electrodes (e.g. an anode and a cathode) separated by one or more layers including an organic active layer. In one embodiment, the exemplary electronic device may also include a second structure that has a negative slope, such as an electrode separator (e.g. cathode separator).

In one exemplary embodiment, the array of organic electronic components may be part of a passive matrix. In another exemplary embodiment, the array of organic electronic components may be part of an active matrix. As such, exemplary embodiments of the electronic device may include active matrix and passive matrix displays.

Generally, each organic electronic component includes two electrodes separated by one or more organic active layers. In addition, other layers, such as hole-transport layers and electron-transport layers, may be included between the two electrodes. Structures having openings that correspond to the perimeter of each of the organic electronic components define wells within which, portions of the organic electronic components are formed. As such, these structures may periodically be described as well structures herein.

The cross-section of the well structures may influence organic layer formation. FIG. 3 illustrates a cross-sectional view of an exemplary structure 302. The structure 302 has a negatively sloped wall or perimeter 304 and forms an acute angle with underlying structure 308. FIG. 4 illustrates a portion of a perimeter of an exemplary structure 402 that forms an acute angle $\alpha$ (alpha) between the surface of an underlying structure 406 and the structure wall 404. In one exemplary embodiment, the angle $\alpha$ (alpha) is between 0° and 90°, such as between 0° and 60° or between 10° and 45°. In an alternative embodiment, the angle $\alpha$ (alpha) may be about equal to or greater than the capillary angle.

Figure 1:
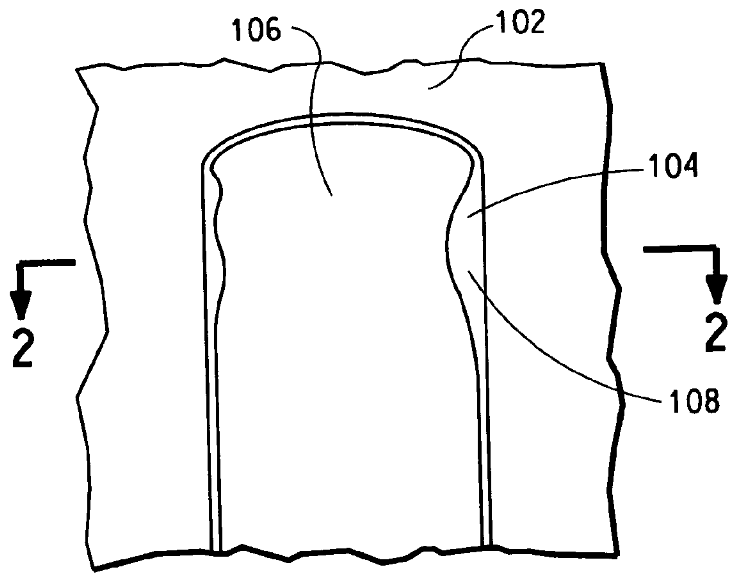
FIGS. 1 and 2 include illustrations of a plan view and a cross-sectional view, respectively, of a portion of a prior art well structure.
Figure 2:
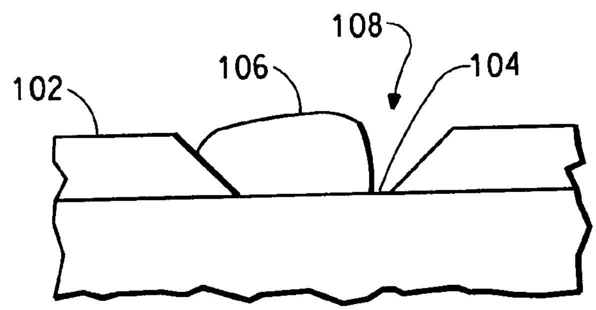
Figure 5:
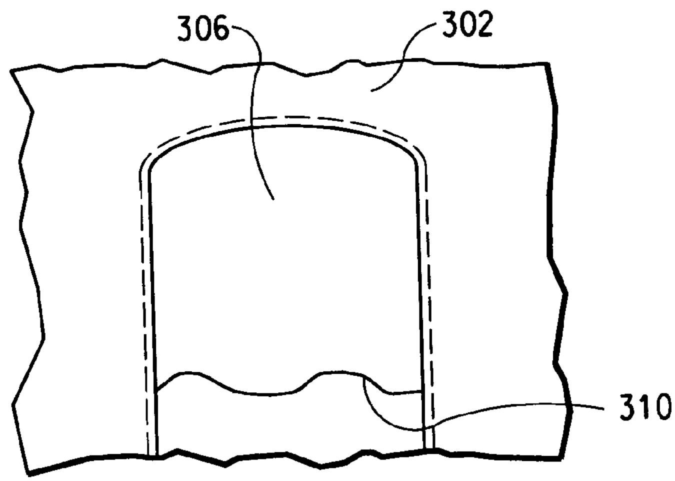
Figure 6:
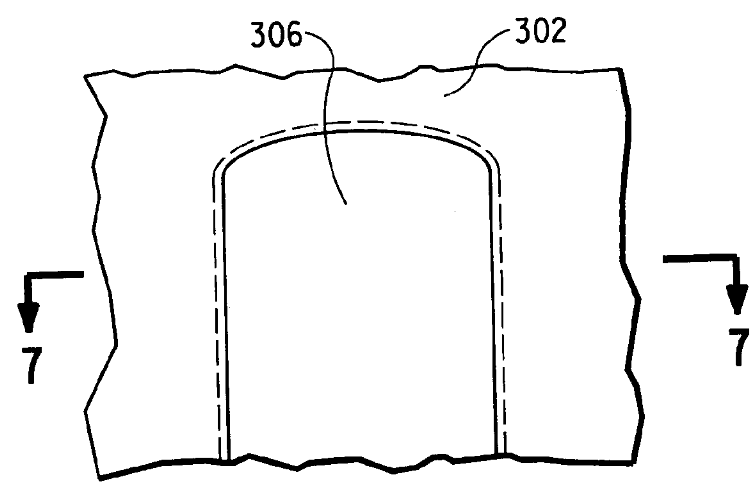
Figure 7:
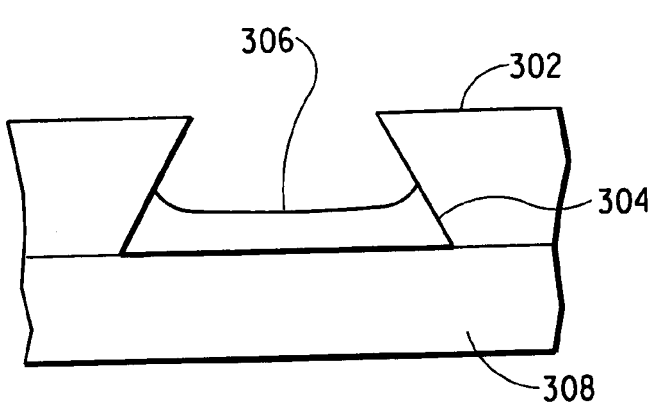

As illustrated in FIG. 5, when a liquid composition 306 is deposited into the perimeter of an opening formed by the structure 302, fingers 310 can be seen. As the opening within structure 302 fills, the liquid composition forms a layer without voids. FIG. 6 illustrates a plan view of a filled opening, and FIG. 7 illustrates a cross-sectional view at sectioning line 7—7 of FIG. 6. When the liquid composition 306 is deposited along the perimeter 304, it covers the underlying structure 308. In one exemplary embodiment, the liquid forms a layer that is substantially more uniform as compared to a similar structure and liquid composition as illustrated in FIGS. 1 and 2.

Figure 8:
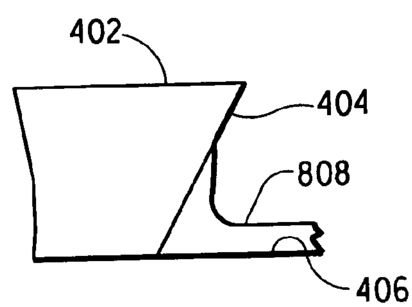

Regarding the structure of FIG. 4, FIG. 8 illustrates a layer 808 formed overlying surface 406. A liquid composition may be deposited and the solvent extracted to form layer 808. As is illustrated, layer 808 contacts structure wall 404 and covers surface 406. Electronic devices including such a layer are less likely to short. In addition, the more uniform layer reduces the likelihood of poor device performance characteristics (e.g., low rectification ratio, low luminance efficiency, etc.) found in devices where thinning of the organic layers near the well structures is observed.

In one embodiment, an electronic device includes a substrate, a first structure having a negative slope, and a second structure having a negative slope when viewed from a cross-sectional view. The first structure overlies the substrate and, from a plan view, has a first pattern. The second structure overlies the substrate and, from a plan view, has a second pattern that is different from the first. In one embodiment, the first structure is a well structure, an array of openings within which organic electronic components may be formed. The second structure may, for example, be an electrode separator structure.

In another embodiment, from a plan view, each opening within the first structure has a perimeter that substantially corresponds to a perimeter of an organic electronic component.

In one example, the second structure may have a thickness between approximately 3 and 10 micrometers. The first structure may have a thickness less than 3 micrometers, such as between approximately 1 and 3 micrometers or less than 1 micrometer such as approximately 0.4 micrometer. The second structure may, for example, have a thickness at least 1.5 times greater than that of the first structure.

In another embodiment, an electronic device includes a substrate, a structure (e.g. a well structure), and a first electrode. The structure has openings and, when viewed from a cross-sectional view, has a negative slope at the openings. From a plan view, each of the openings has a perimeter that substantially corresponds to a perimeter of an organic electronic component. The first electrode overlies the structure and lies within the openings. Portions of the first electrode overlying the structure and lying within the openings are connected to each other. In a particular example, the organic electronic component may include one or more organic active layers. In one embodiment, the first electrode may be a common electrode (e.g., common cathode or common anode for an array of organic electronic components). In another exemplary embodiment, a second electrode may lie between the substrate and the structure. In a further exemplary embodiment, the organic electronic component may be coupled to a driver circuit (not shown) lying within the substrate. Note that the second electrode may be formed before the fist electrode in one embodiment.

In one exemplary embodiment, the structure or structures having the negative slope have substantially hydrophobic surfaces. The surfaces exhibit wetting angles with liquid compositions greater than 45°, such as 90° or higher. In contrast, underlying structures, such as electrodes may have substantially hydrophilic surfaces, exhibiting wetting angles of liquid compositions less than 90°, such as less than 60° or between approximately 0° and about 45°.

3. Process for Forming Electronic Devices

An exemplary process for forming electronic devices includes forming one or more structures that overlie a substrate and have a negative slope from a cross-sectional perspective. One exemplary process is illustrated in FIGS. 9 through 23, which can be used for a passive matrix display. Variations on this process may be used to form other electronic devices.

Figure 9:
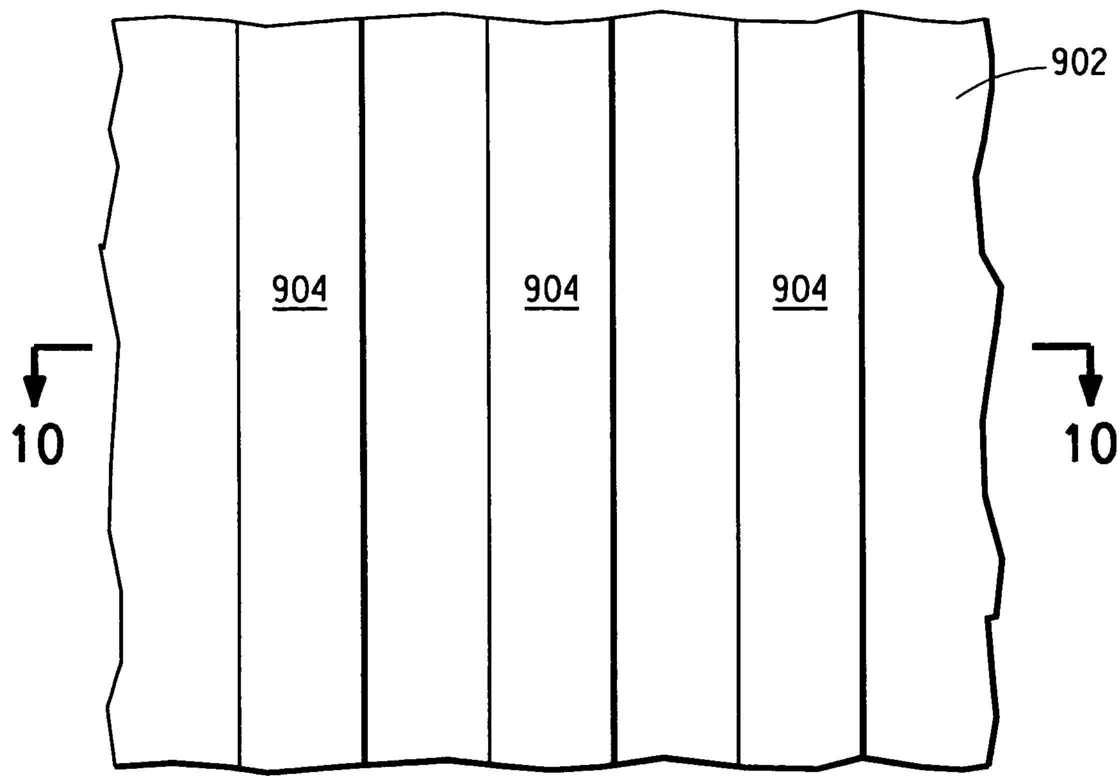
FIGS. 9 and 10 include illustrations of a plan view and a cross-section view, respectively, of a portion of a substrate after forming first electrodes over the substrate.
Figure 10:
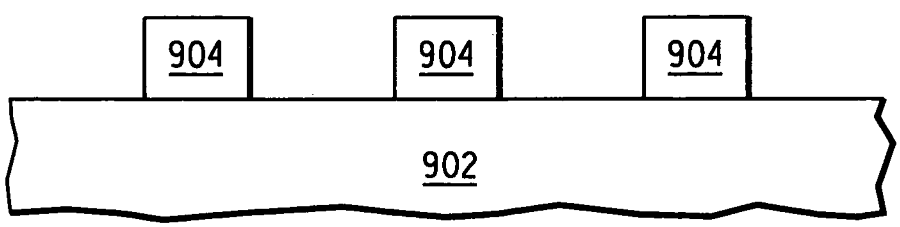

FIG. 9 depicts a plan view of a portion of an exemplary process sequence, and FIG. 10 depicts a cross-sectional view of the portion as viewed from sectioning line 10—10 in FIG. 9. Electrodes 904 are deposited on a substrate 902. The substrate 902 may be a glass or ceramic material or a flexible substrate comprising at least one polymer film. In one exemplary embodiment, the substrate 902 is transparent. Optionally, the substrate 902 may include a barrier layer, such as a uniform barrier layer or a patterned barrier layer.

The electrodes 904 may be anodes or cathodes. FIG. 9 depicts the electrodes 904 as parallel strips. Alternately, the electrodes 904 may be a patterned array of structures having plan view shapes, such as squares, rectangles, circles, triangles, ovals, and the like. Generally, the electrodes may be formed using conventional processes (e.g. deposition, patterning, or a combination thereof).

The electrodes 904 may include conductive material. In one embodiment, the conductive material may include a transparent conductive material, such as indium-tin-oxide (ITO). Other transparent conductive materials include, for example, indium-zinc-oxide, zinc oxide, and tin oxide. Other exemplary conductive materials include, zinc-tin-oxide (ZTO), elemental metals, metal alloys, and combinations thereof. The electrodes 904 may also be coupled to conductive leads (not shown). In one exemplary embodiment, the electrodes 904 may have hydrophilic surfaces.

Figure 11:
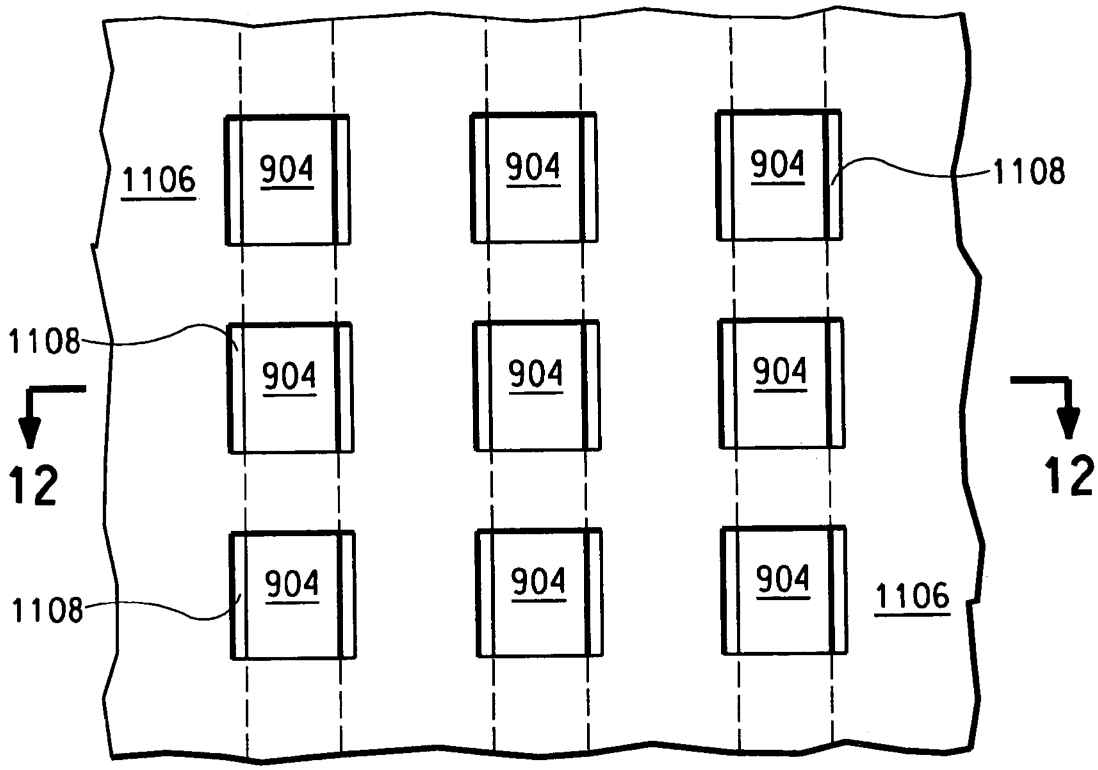
FIGS. 11 and 12 include illustrations of a plan view and a cross-section view, respectively, of the substrate of FIGS. 9 and 10 after forming a well structure over the substrate and first electrode.
Figure 12:
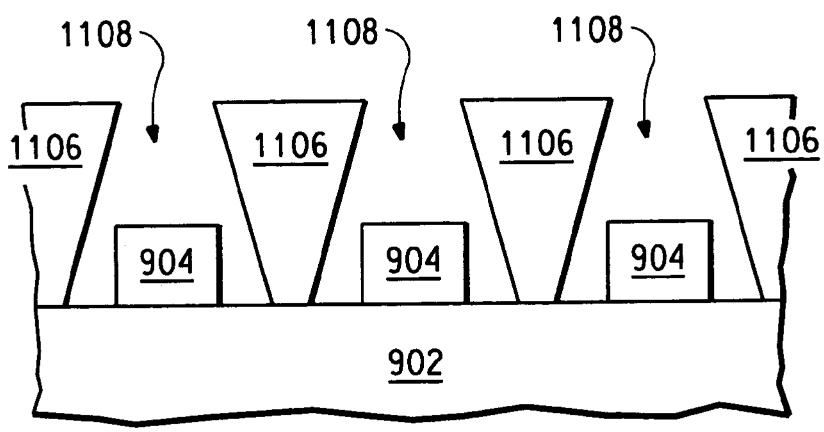

A subsequent layer may be deposited and patterned into structures that, from a cross-sectional view, have a negative slope. FIG. 11 depicts a plan view of this sequence in the process, and FIG. 12 illustrates a cross-sectional view of the sequence. A structure 1106 is formed that has openings 1108 and has a negative slope at the openings 1108, as viewed from a cross-sectional view. The openings 1108 may expose portions of electrodes 904. As seen from the plan view, the bottom of the openings 1108 may include portions of the electrodes 904 or may also encompass a portion of the substrate 902.

In one exemplary embodiment, the structure 1106 may be formed from resist or polymeric layers. The resist may, for example, be a negative resist material or positive resist material. The resist may be deposited on the substrate 902 and over the electrodes 904. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing. The resist may be patterned through selective exposure to radiation, such as ultraviolet (UV) radiation. In one embodiment, the resist is spin deposited and baked (not shown). The resist is exposed to UV radiation through a mask (not shown), developed, and baked, leaving a structure having a negative slope at the openings. The negative slope can be achieved by (1) using a UV flood exposure (not collimated) when using the masks or (2) overexposing the resist layer while the mask lies between the resist layer and a radiation source (not shown).

In another exemplary embodiment, a sacrificial structure may be used. In one embodiment, a sacrificial layer is deposited and patterned to form a sacrificial structure having a positive slope. In a more specific embodiment, from a cross-sectional view, the sacrificial structure has a complementary profile as compared to the first structure 1106 that is subsequently formed. The thickness of the sacrificial layer is substantially the same as the subsequently formed first structure. In one embodiment, a sacrificial layer is deposited over the first electrodes 904 and the substrate 902. A patterned resist layer is formed over the sacrificial layer using a conventional technique. In one specific embodiment, a conventional resist-erosion etching technique is used to form sloped sidewalls. In another specific embodiment, a conventional isotropic etch is used. The patterned resist layer is then removed using a conventional resist removal process.

Another layer that will be used for the first structure 1106 is deposited over the sacrificial structure and within openings in the sacrificial structure. In one embodiment, that other layer has a thickness of at least as thick as the thickness of the sacrificial structures. In other embodiment, that other layer is substantially thicker than the sacrificial layer. Portions of the other layer lying outside the sacrificial structure are removed using an etching or polishing technique that is conventional within the inorganic semiconductor arts. After the portions have been removed, the first structure is formed. The sacrificial structure is then removed to form the openings 1108 within the first structure 1106.

In one embodiment, the materials for the first and sacrificial structures are different to allow the material of one of the first and sacrificial structures to be removed selectively compared to the other structure. Exemplary materials include metals, oxides, nitrides, and resists. The material for the sacrificial layer may be selected so that it can be selectively removed from the substrate 902 without causing significant damage to the first electrodes 904. After reading this specification, skilled artisans will be able to choose materials that meet their needs or desires.

Figure 13:
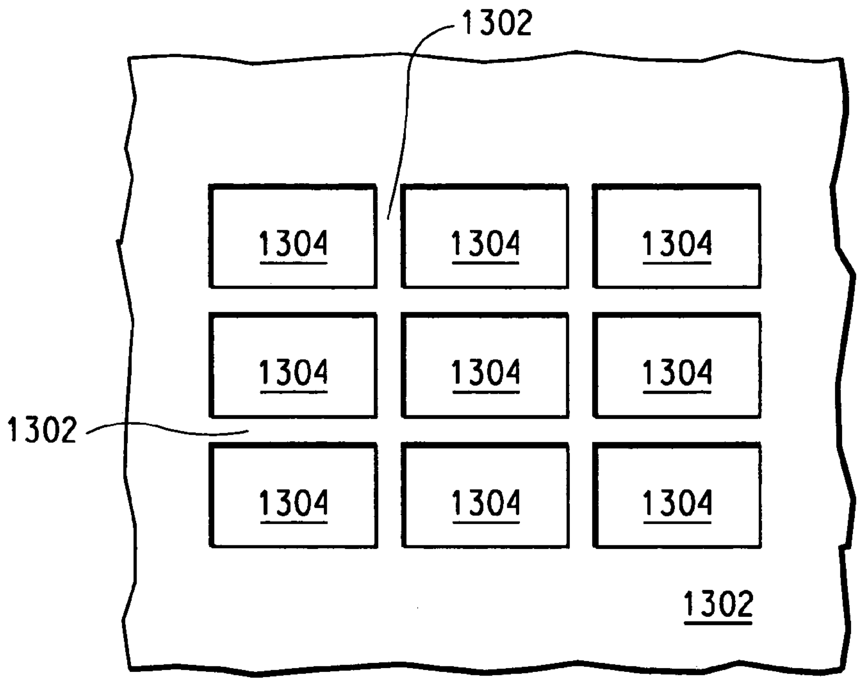
FIGS. 13 and 14 include cross-sectional views illustrating exemplary well structure patterns.
Figure 14:
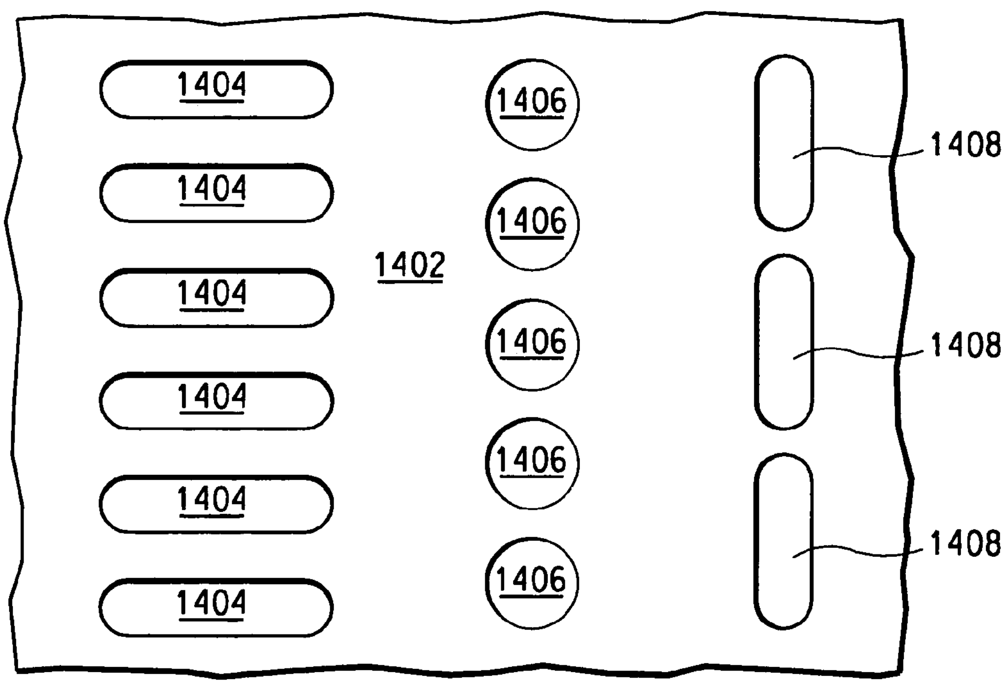

After formation, the structure 1106 may have a pattern. The pattern may, for example, be the pattern illustrated in FIG. 11. Alternative patterns are illustrated in FIGS. 13 and 14. FIG. 13 illustrates a latticework pattern. FIG. 14 illustrates patterns that may include oval shaped openings 1404 oriented across underlying electrodes, circular openings 1406, and oval openings 1408 oriented along underlying electrodes, as view from a plan view.

In another embodiment, another pattern may include columns oriented substantially parallel to the lengths of electrodes 904. Each of the columns has the negative slope and has at least a portion covering the substrate 902 at locations adjacent to and between the electrodes 904. A combination of the columns with subsequently-formed electrode separator structures can result in rectangular openings, from a plan view. The combination of structures are formed before any one or more of the liquid compositions are formed over the substrate.

Figure 15:
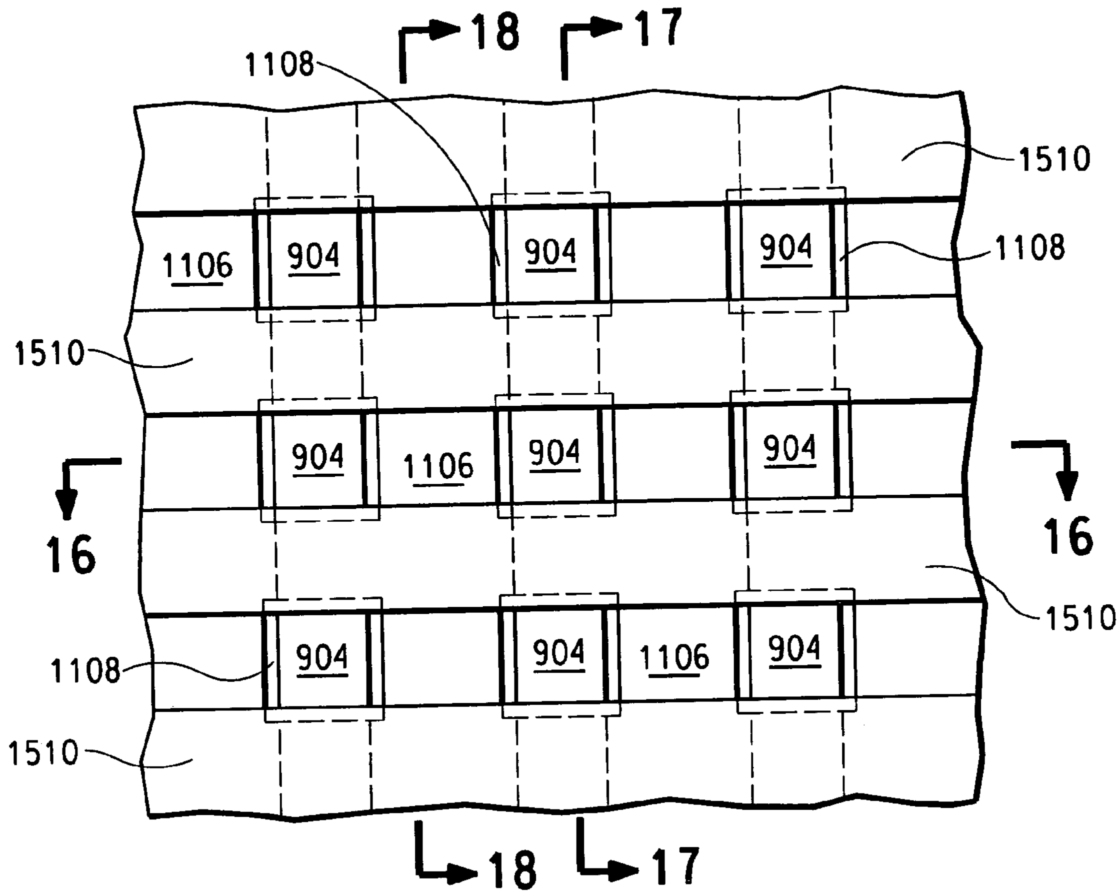
FIG. 15 includes an illustration of a plan view of the substrate of FIGS. 11 and 12 after forming a separator structure over the substrate, first electrode, and well structure.
Figure 16:
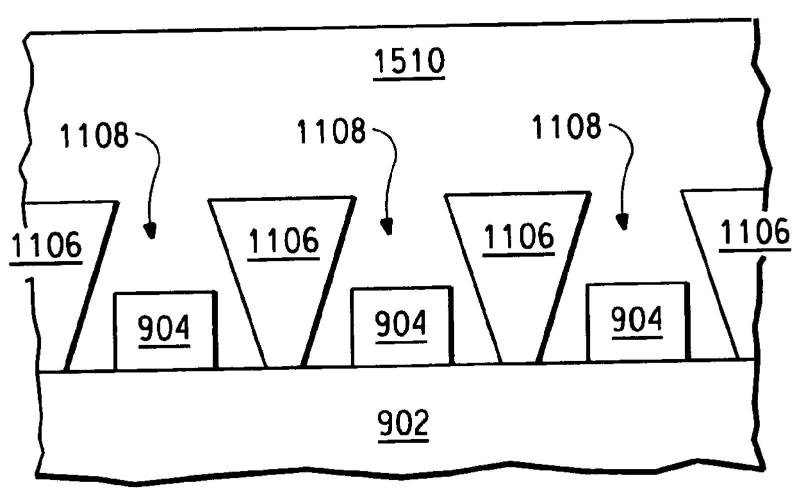
FIGS. 16, 17, and 18 include illustrations of cross-section views at sectioning lines 16—16, 17—17 and 18—18, respectively, of FIG. 15.
Figure 17:
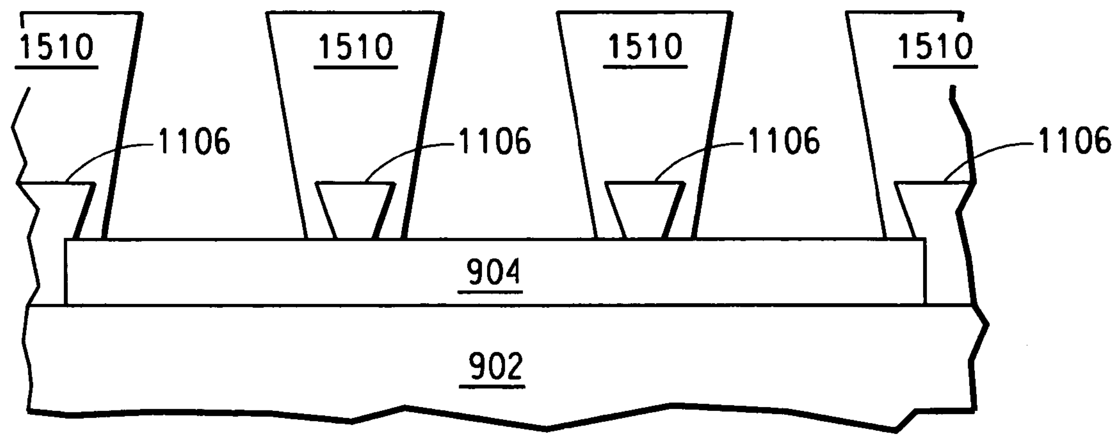
Figure 18:
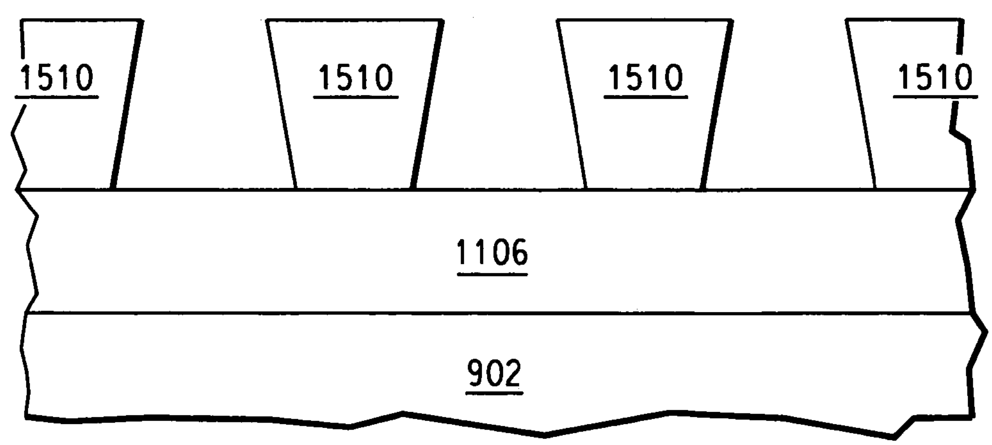

A second structure may, optionally, be deposited over the substrate 902 and the structure 1106. The second structure may or may not contact portions of the electrodes 904 depending on the pattern of the first structure 1106. The second structure may, for example, be an electrode separator structure. FIGS. 15, 16, 17, and 18 illustrate an exemplary process sequence including the second structures 1510. FIG. 15 illustrates a plan view including the second structures 1510 oriented substantially perpendicular to the electrode structures 904. FIG. 16 illustrates a cross-sectional view between and parallel to the lengths of the second structures 1510 at sectioning line 16—16. FIGS. 17 and 18 illustrate cross-sectional views perpendicular to the second structures 1510. FIG. 17 illustrates a cross-sectional view through openings 1108 at sectioning line 17—17, and FIG. 18 illustrates a cross-sectional view away from openings 1108 at sectioning line 18—18.

As illustrated in FIGS. 17 and 18, the cross-sectional view of the second structure 1510 has a negative slope. The second structure 1510 may or may not encompass portions of the first structure 1106 at the openings. In an alternate embodiment, the second structure 1510 may be formed to entirely overlie the first structure 1106. In general, the second structure 1510 may be formed through techniques similar to those described in relation to the first structure 1106.

Once the first structure 1106 and, optionally, the second structure 1510 are formed, the electrodes 904 exposed via the openings may be cleaned, such as through UV/ozone cleaning. The structures 1108 and 1510 may be treated to produce hydrophobic surfaces. For example, fluorine-containing plasma may be used to treat the surfaces of the structures 1108 and 1510. The fluorine plasma may be formed using gasses such as $CF_4$, $C_2F_6$, $NF_3$, $SF_6$, or combinations thereof. The plasma process may include direct exposure plasma or use a downstream plasma. In addition, the plasma may include $O_2$. In one exemplary embodiment, a fluorine-containing plasma may include 0–20% $O_2$, such as about 8% $O_2$.

In one particular embodiment, the plasma is produced using a March PX500 model plasma generator by March Plasma Systems of Concord, Calif. The equipment is configured in flow through mode with a perforated, grounded plate and a floating substrate plate. In this embodiment, a 6-inch floating substrate plate is treated with a plasma formed from a $CF_4/O_2$ gas composition. The gas composition may include 80–100% $CF_4$, such as approximately 92% $CF_4$, and 0–20% $O_2$, such as approximately 8% $O_2$ by volume. The substrate may be exposed for 2–5 minutes, such as approximately 3 minutes, at a pressure of 300–600 mTorr, such as a 400 mTorr, using a 200–500 W plasma, such as a 400 W plasma.

FIGS. 19 and 20 illustrate an exemplary sequence in the process in which an organic layer 1913 is deposited. The organic layer 1913 may include one or more organic layers. In one embodiment as illustrated in FIG. 20, the organic layer 1913 includes a charge transport layer 1914 and an organic active layer 1912. When present, the charge transport layer 1914 is formed over the first electrodes 904 and before the organic active layer 1912 is formed. The charge transport layer 1914 can serve multiple purposes. In one embodiment, the charge transport layer 1914 is a hole-transport layer. Although not shown, an additional charge transport layer may be formed over the organic active layer 1912. Therefore, the organic layer 1913 may include the organic active layer 1912 and one, both or none of the charge transport layers. Each of the charge transport layer 1914, organic active layer 1912, and additional charge transport layer may include one or more layers. In another embodiment, a single layer having a graded or continuously changing composition may be used instead of separate charge transport and organic active layers.

Returning to FIGS. 19 and 20, the charge transport layer 1914 and the organic active layer 1912 are formed sequentially over the electrodes 904. Each of the charge transport layer 1914 and the organic active layer 1912 can be formed by, for example, but not limited to, continuous deposition techniques such as spin coating, gravure coating, curtain coating, dip coating, slot-die coating, spray coating, and continuous nozzle coating; discontinuous deposition techniques such as ink jet printing, gravure printing, and screen printing; casting; and vapor depositing. For example, liquid compositions including the organic materials may be dispensed-through nozzles, such as micronozzles. One or both of the charge transport layer 1914 and the organic active layer 1912 may be cured after application.

In this embodiment, the charge transport layer 1914 is a hole-transport layer. The hole-transport layer can be used to potentially increase the lifetime and improve the reliability of the device compared to a device where the conductive members 904 would directly contact the organic active layer 1912. In one specific embodiment, the hole-transport layer can include an organic polymer, such as polyaniline ("PANI"), poly(3,4-ethylenedioxythiophene) ("PEDOT"), or an organic charge transfer compound, such as tetrathiafulvalene tetracyanoquinodimethane (TTF-TCQN). The hole-transport layer typically has a thickness in a range of approximately 100–250 nm.

The hole-transport layer typically is conductive to allow electrons to be removed from the subsequently formed active region and transferred to the conductive members 904. Although the conductive members 904 and the optional hole-transport layer are conductive, typically the conductivity of the conductive members 904 is significantly greater than the hole-transport layer.

The composition of the organic active layer 1912 typically depends upon the application of the organic electronic device. When the organic active layer 1912 is used in a radiation-emitting organic electronic device, the material(s) of the organic active layer 1912 will emit radiation when sufficient bias voltage is applied to the electrode layers. The radiation-emitting active layer may contain nearly any organic electroluminescent or other organic radiation-emitting materials.

Such materials can be small molecule materials or polymeric materials. Small molecule materials may include those described in, for example, U.S. Pat. No. 4,356,429 and U.S. Pat. No. 4,539,507. Alternatively, polymeric materials may include those described in U.S. Pat. No. 5,247,190, U.S. Pat. No. 5,408,109, and U.S. Pat. No. 5,317,169. Exemplary materials are semiconducting conjugated polymers. An example of such a polymer is poly(phenylenevinylene) ("PPV"). The light-emitting materials may be dispersed in a matrix of another material, with or without additives, but typically form a layer alone. The organic active layer generally has a thickness in the range of approximately 40–100 nm.

When the organic active layer 1912 is incorporated into a radiation receiving organic electronic device, the material(s) of the organic active layer 1912 may include many conjugated polymers and electroluminescent materials. Such materials include, for example, many conjugated polymers and electro- and photo-luminescent materials. Specific examples include poly(2-methoxy,5-(2-ethyl-hexyloxy)-1,4-phenylenevinylene) ("MEH-PPV") and MEH-PPV composites with CN-PPV. The organic active layer 1912 typically has a thickness in a range of approximately 50–500 nm.

Although not shown, an optional electron-transport layer may be formed over the organic active layer 1912. The electron-transport layer is another example of a charge transport layer. The electron-transport layer typically is conductive to allow electrons to be injected from a subsequently formed cathode and transferred to the organic active layer 1912. Although the subsequently formed cathode and the optional electron-transport layer are conductive, typically the conductivity of the cathode is significantly greater than the electron-transport layer.

In one specific embodiment, the electron-transport layer can include metal-chelated oxinoid compounds (e.g., Alq3); phenanthroline-based compounds (e.g., 2,9-dimethyl-4,7-diphenyl-1,10-phenanthroline ("DDPA"), 4,7-diphenyl-1,10-phenanthroline ("DPA")); azole compounds (e.g., 2-(4-biphenyl)-5-(4-t-butylphenyl)-1,3,4-oxadiazole ("PBD"), 3-(4-biphenyl)-4-phenyl-5-(4-t-butylphenyl)-1,2,4-triazole ("TAZ"); or any one or more combinations thereof. Alternatively, the optional electron-transport layer may be inorganic and comprise BaO, LiF, or $Li_2O$. The electron-transport layer typically has a thickness in a range of approximately 30–500 nm.

Any one or more of the charge transport layer 1914, organic active layer 1912, and additional charge transport layer may be applied as a liquid composition that includes one or more liquid media. The hydrophobic and hydrophilic surfaces are specific with respect to the liquid media within the liquid composition. In one embodiment, the liquid composition may include a co-solvent including, for example, alcohols, glycols, and glycol ethers. A solvent for the organic active layer liquid media may be select such that it does not dissolve the charge transport layer. Alternatively, the solvent may be selected such that the charge transport layer is soluble or partially soluble in that solvent.

In a particular embodiment, the negative slope of the structure 1106 causes a capillary effect, drawing a liquid composition of the organic material around the perimeter of the openings 1108. Once cured, the organic active layer 1912 covers underlying layers within the openings 1106, such as the electrodes 904 and charge transport layer 1914, preventing electrical shorting between conductive members, such as electrodes (e.g. anodes and cathodes).

A second electrode is formed over the organic layers 1913, which in this embodiment includes the charge transport layer 1914 and the organic active layer 1912. FIG. 21 illustrates a plan view of the process sequence and FIGS. 22 and 23 illustrate cross-sectional views of the process sequence. In one embodiment, a layer is deposited using a stencil mask to form conductive members 2118 on the second structures 1510 and forming electrodes 2116 over organic active layers 1913 and over portions of the structure 1106. The difference in elevation between electrode 2116 and conductive members 2118 keeps them from being connected. As illustrated in FIG. 22, electrode layer 2116 overlies layers within the openings 1108 and portions of the first structure 1106. The portions of electrode layer 2116 overlying the layers within the openings 1108 and the portions of the electrode 2116 overlying portions of the first structure 1106 are connected to each other to form an electrically continuous structure.

In one embodiment, the electrodes 2116 act as cathodes. A layer of the electrodes 2116 closest to the organic layer 1913 can be selected from Group 1 metals (e.g., Li, Cs), the Group 2 (alkaline earth) metals, the rare earth metals including the lanthanides and the actinides. The electrode layers 2116 and 2118 have a thickness in a range of approximately 300–600 nm. In one specific, non-limiting embodiment, a Ba layer of less than approximately 10 nm followed by an Al layer of approximately 500 nm may be deposited. The Al layer may be replaced by or used in conjunction with any of the metals and metal alloys.

As depicted in the FIGS. 21, 22, and 23, the organic electronic components formed from an anode, such as electrode 904, the organic layers 1913, and a cathode, such as electrode 2116 are addressable via a peripheral circuitry. For example, applying a potential across one selected row of electrodes 2116 and one selected column of electrodes 904 activate one organic electronic component.

An encapsulating layer (not shown) can be formed over the array and the peripheral and remote circuitry to form a substantially complete electrical device, such as an electronic display, a radiation detector, and a photovoltaic cell. The encapsulating layer may be attached at the rail such that no organic layers lie between it and the substrate. Radiation may be transmitted through the encapsulating layer. If so, the encapsulating layer should be transparent to the radiation.

4. Other Embodiments

After formation of the organic electronic components, the first structure 1106 and the second structures 1510 may optionally be altered or removed. In one exemplary embodiment, the electronic device may be heated to about a glass transition temperature of the material forming structure 1106 or structures 1510. Such heating may result in reflow, causing the slope of the structures to change in the final device, as viewed from a cross-sectional perspective. In another embodiment, an etch process may be used to remove structures, such as structure 1106. As such, the cross-sectional appearance of the final electronic device may be different than the structures and layers depicted in FIGS. 21, 22, and 23.

The electronic device formed through the process illustrated in FIGS. 9–23 is a passive matrix device. In an alternate embodiment, the electronic device may be an active matrix device. FIGS. 24 and 25 illustrate an exemplary active matrix device. FIG. 25 illustrates the cross section of an electronic component at sectional lines 25—25 in FIG. 24. Each organic electronic component 2416 may include a unique electrode 2406 having an associated driver circuit 2418. The driver circuit 2418 may be incorporated into a substrate 2402 over which the unique electrode 2406 is formed. A well structure 2404 may have openings corresponding to the perimeter of the organic electronic components 2416. Other structures, such as some of the other well structures described with respect to a passive matrix device, may be used in other embodiments. The well structure 2404 has a negative slope at the openings when viewed from a cross-sectional perspective. Organic layer 2408 may overlie the unique electrode 2406 and may include hole-transport layer 2412 and organic active layer 2410. Optionally, the organic layer 2408 may include an electron-transport layer (not shown). In addition, the organic electronic components 2416 may include a common electrode 2414. Each organic electronic component 2416 may then be activated through an active matrix mechanism, such as through the driver circuits 2418.

In the various embodiments illustrated above, the electrodes may be cathodes or anodes. For example, the electrode 904 may be an anode or a cathode. Similarly, electrode 2116 may be an anode or a cathode. In one particular embodiment electrode 904 is a transparent anode overlying a transparent substrate 902. For electronic display devices, radiation emitted from organic electronic components may emit through the transparent anode and the substrate. Alternately, the electrode 904 may be a transparent cathode.

In another embodiment, the electrode 904 and the substrate 902 may be opaque or reflective. In this embodiment, electrode 2116 may be formed of a transparent material and, for radiation emitting devices, radiation may be emitted from organic electronic component through electrode 2116.

In a further embodiment, the process for forming the electronic device may be used in fabricating radiation responsive devices, such as sensor arrays, photodetectors, photoconductive cells, photoresistors, photoswitches, phototransistors, phototubes, IR detectors, biosensors, photovoltaics or solar cells. Radiation responsive devices may include a transparent substrate and substrate side electrode. Alternatively, the radiation responsive device may include a transparent overlying electrode.

In still a further embodiment, the process for forming the electronic device may be used for inorganic devices. In one embodiment, a liquid composition for forming an inorganic layer may be used and allow better coverage of the liquid composition adjacent to the same or other structures having a negative slope.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of the invention.

Benefits, other advantages, and solutions to problems have been described above with regards to specific embodiments. However, the benefits, advantages, solutions to problems, and any element(s) that may cause any benefit, advantage, or solution to occur or become more pronounced are not to be construed as a critical, required, or essential feature or element of any or all of the claims.

What is claimed is:

1. An electronic device comprising:

a substrate;

a structure having openings, wherein from a cross-sectional view, the structure, at the openings, has a negative slope, wherein from a plan view, each opening has a perimeter that substantially corresponds to a perimeter of an organic electronic component; and a first electrode overlying the structure and lying within the openings, wherein portions of the first electrode overlying the structure and lying within the openings are connected to each other.

2. The electronic device of claim 1, wherein the organic electronic component comprises an organic active layer.

3. The electronic device of claim 2, wherein a surface of the structure is hydrophobic.

4. The electronic device of claim 1, further comprising a second electrode lying between the substrate and the structure.

5. The electronic device of claim 4, wherein the second electrode has a surface that is hydrophilic.

6. The electronic device of claim 1, wherein the substrate comprises a driver circuit coupled to the organic electronic component.

7. An electronic device comprising:

a substrate;

a first structure overlying the substrate, wherein:

from a cross-sectional view, the first structure has a negative slope; and from a plan view, the first structure has a first pattern; and a second structure overlying the substrate, wherein:

from a cross-sectional view, the second structure has a negative slope;

from a plan view, the second structure has a second pattern different from the first pattern; and the first structure has a portion that contacts the second structure.

8. The electronic device of claim 7, wherein the first structure comprises openings, wherein from a plan view, each opening has a perimeter that substantially corresponds to a perimeter of an organic electronic component.

9. The electronic device of claim 8, further comprising an electrode overlying at least portions of the first structure and the second structure.

10. The electronic device of claim 9, wherein the electrode lies within the openings and is continuous between the openings.

11. The electronic device of claim 8, wherein the organic electronic component comprises an organic active layer.

12. The electronic device of claim 7, wherein the second structure has a thickness at least 1.5 times greater than a thickness of the first structure.

13. The electronic device of claim 7, wherein the first structure has a thickness no more than about 3 micrometers.

14. The electronic device of claim 7, wherein the second structure has a thickness at least about 3 micrometers.

15. The electronic device of claim 7, further comprising an electrode between the substrate and the first structure.

16. The electronic device of claim 15, wherein the electrode has a surface that is hydrophilic.

17. The electronic device of claim 7, wherein the electronic device comprises a passive matrix display.

18. The electronic device of claim 7, wherein the first structure and the second structure have surfaces that are hydrophobic.

19. A process for forming an electronic device comprising the steps of:

forming a structure having a negative slope and openings, wherein from a plan view, each opening has a perimeter that substantially corresponds to a perimeter of an organic electronic component;

depositing an organic active layer within the opening, wherein the organic active layer has a liquid composition; and forming a first electrode overlying the structure and the organic active layer and lying within the openings, wherein portions of the first electrode overlying the structure and lying within the openings are connected to each other.

20. The process of claim 19, further comprising forming a second electrode before forming the structure, wherein after forming the structure, portions of the second electrode are exposed along the bottoms of the openings.

21. The process of claim 20, wherein the liquid composition contacts the second electrode at a wetting angle of less than 90 degrees.

22. The process of claim 20, wherein the liquid composition contacts the structure at a wetting angle of at least 45 degrees.

* * * * *